US007064610B2

(12) United States Patent
Wang et al.

(10) Patent No.: US 7,064,610 B2
(45) Date of Patent: Jun. 20, 2006

(54) DIFFERENTIAL AMPLIFIER WITH LARGE INPUT COMMON MODE SIGNAL RANGE

(75) Inventors: Hongwei Wang, Irvine, CA (US); Ardie Venes, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/117,469

(22) Filed: Apr. 29, 2005

(65) Prior Publication Data

US 2005/0195032 A1    Sep. 8, 2005

Related U.S. Application Data

(63) Continuation of application No. 10/015,587, filed on Dec. 17, 2001.

(60) Provisional application No. 60/256,126, filed on Dec. 15, 2000.

(51) Int. Cl.
*H03F 3/45* (2006.01)
(52) U.S. Cl. ....................................... 330/253; 330/258
(58) Field of Classification Search ................ 330/253, 330/258, 255
See application file for complete search history.

(56) References Cited

U.S. PATENT DOCUMENTS

| | | | |
|---|---|---|---|
| 4,555,673 A * | 11/1985 | Huijsing et al. | 330/258 |
| 5,142,238 A | 8/1992 | White | |
| 5,280,199 A | 1/1994 | Itakura | |
| 5,371,474 A | 12/1994 | Wassenaar et al. | |
| 5,382,917 A * | 1/1995 | Miyake et al. | 330/255 |
| 5,604,464 A | 2/1997 | Hwang et al. | |
| 5,955,921 A * | 9/1999 | Ide et al. | 330/254 |
| 6,121,836 A * | 9/2000 | Vallencourt | 330/253 |
| 6,157,257 A | 12/2000 | Murphy | |

FOREIGN PATENT DOCUMENTS

| | | |
|---|---|---|
| EP | 0 723 352 A2 | 7/1996 |
| WO | WO 99/16173 A1 | 4/1999 |

OTHER PUBLICATIONS

Gray, P.R. et al., *Analysis and Design of Analog Integrated Circuits*, Fourth Edition, John Wiley & Sons, Inc., pp. ix-xviii, 217-232 and 253-336 (2001).
IEEE Std 1596.3-1996—Description, from http://standards.ieee.org/reading/ieee/std_public/description/busarch/1596.3-1996_desc.html, 2 pages (last update: Mar. 31, 1999).
Copy of International Search Report from PCT Application No. PCT/US01/47977, filed Dec. 17, 2001, 7 pages.

* cited by examiner

*Primary Examiner*—Patricia Nguyen
(74) *Attorney, Agent, or Firm*—Sterne, Kessler, Goldstein & Fox P.L.L.C.

(57) ABSTRACT

A design for a differential amplifier with a large input common mode signal range. The differential amplifier comprises two differential pairs, each having two amplifying MOSFETs. A source follower is connected to the gate terminal of each amplifying MOSFET in one of the differential pairs. A differential signal applied to the differential amplifier comprises two separate signal. Each separate signal is applied to the gate terminals of both the amplifying MOSFET in the differential pair not driven by the source follower and the driven MOSFET of the source follower. The differential amplifier further comprises a pair of switch MOSFETs connected to a current source MOSFET. The switch MOSFETs act to control the distribution of the total current flowing from the current source MOSFET and, consequently, to determine which differential pair works dominantly to amplify the input signals. Each source follower acts to offset the voltage of its input signal to compensate for the range loss due to the bias voltages and the threshold voltages within the differential amplifier.

16 Claims, 10 Drawing Sheets

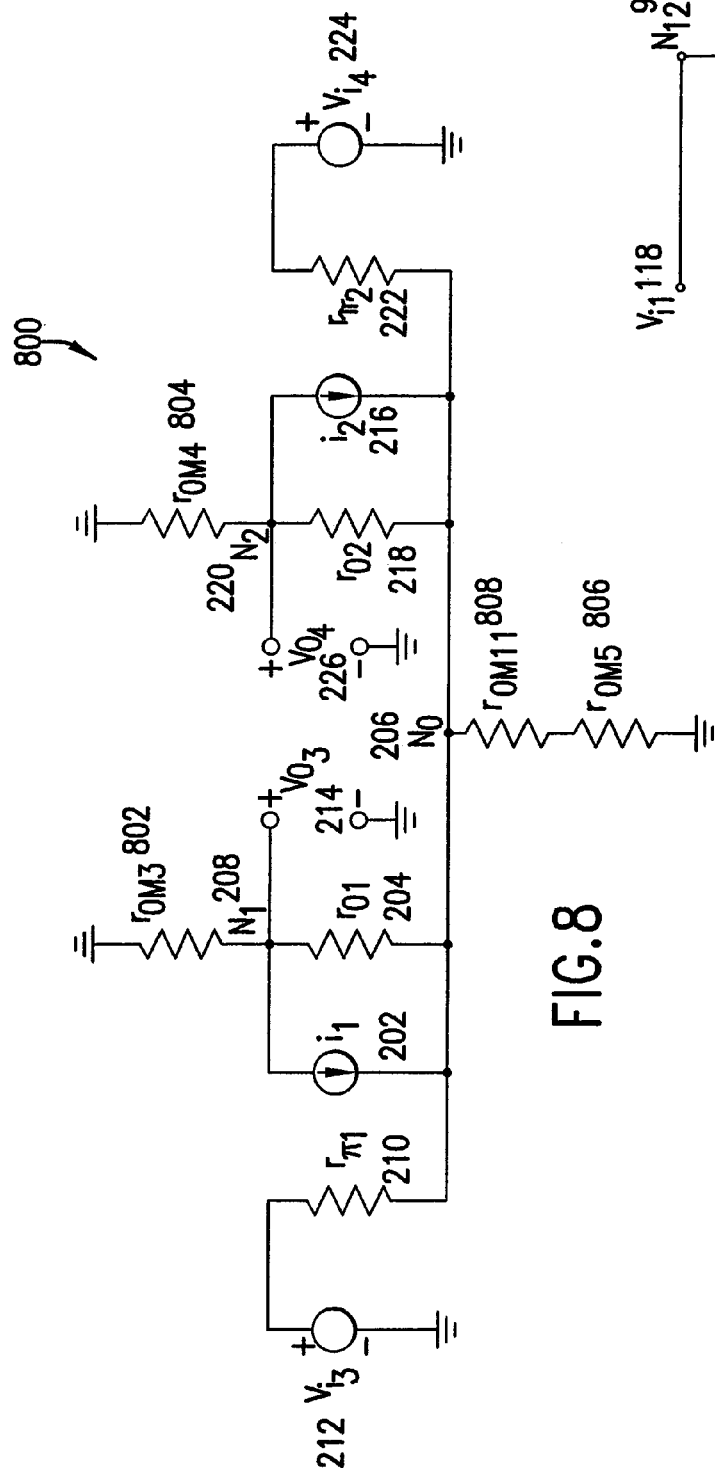
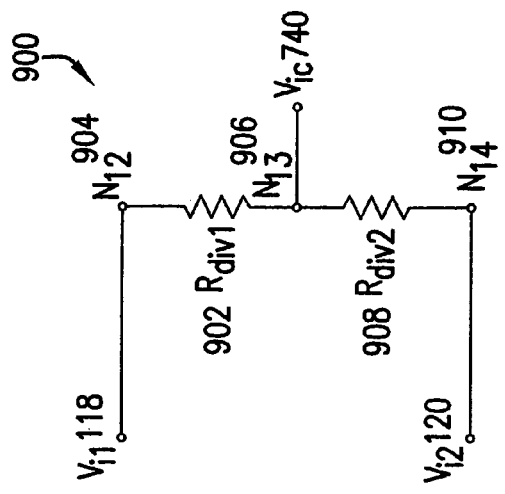
FIG. 8
FIG. 9

DIFFERENTIAL AMPLIFIER WITH LARGE INPUT COMMON MODE SIGNAL RANGE

This application is a continuation of U.S. application Ser. No. 10/015,887, filed Dec. 17, 2001, which is incorporated herein in its entirety by reference and which claims the benefit of U.S. Provisional Application No. 60/256,126, filed Dec. 15, 2000.

BACKGROUND OF THE INVENTION

1. Field of the Invention

The present invention relates to a method of extending an input signal range of a component that receives the input signal. Specifically, the present invention relates to a design for an amplifier that extends its input signal range. More specifically, the present invention relates to a design for a differential amplifier with a large input common mode signal range.

2. Background Art

Operational amplifiers are key elements used in many analog and mixed analog/digital applications. Increasingly, these applications are being realized in smaller, portable packages, which require low power supply voltages. This necessity taxes the ability of operational amplifiers to provide the large voltage swings needed to ensure a wide dynamic range.

Conventionally, operational amplifiers are implemented using differential amplifiers to increase the voltage swing. The purpose of a differential amplifier is to sense changes in its differential input signal while rejecting changes in its common mode, or average, input signal. By removing the common mode component of an input signal, differential amplifiers can support relatively large voltage swings.

Differential amplifiers are essential building blocks of most modern IC amplifiers and are predicated on the ability to fabricate matched transistors on a chip. Differential amplifiers are particularly useful for mixed signal applications where noise generated by digital circuits can distort analog signals. Noise appearing on both input signals of a differential circuit is rejected at the output signals.

FIG. 1 is a schematic diagram of a conventional differential amplifier 100. Differential amplifier 100 comprises two transistors "$M_1$" 102 and "$M_2$" 104 with source terminals connected together. A current source "$I_{TAIL}$" 106 is connected in parallel with a resistor "$R_{TAIL}$" 108 between the source terminals and a first power supply voltage "$V_{SS}$" 110. (In an embodiment, $V_{SS}$ 110 could be analog ground.) A resistor is connected to the drain terminal of each transistor. "$R_{D1}$" 112 is connected to the drain terminal of $M_1$ 102; "$R_{D2}$" 114 is connected to the drain terminal of $M_2$ 104. $R_{D1}$ 112 and $R_{D2}$ 114 are together connected to a second power supply voltage "$V_{DD}$" 116. (In an embodiment, $V_{DD}$ 116 could be analog ground.) Differential amplifier 100 receives a differential input signal and produces a differential output signal.

The differential input signal comprises a first input signal "$v_{i1}$" 118, which is applied to the gate terminal of $M_1$ 102, and a second input signal "$v_{i2}$" 120, which is applied to the gate terminal of $M_2$ 104. The differential output signal comprises a first output signal "$v_{o1}$" 122, which is produced at the drain terminal of $M_2$ 104, and a second output signal "$v_{o2}$" 124, which is produced at the drain terminal of $M_1$ 102. Preferably, differential amplifier 100 is balanced such that each component on the side of one output (e.g., $M_1$ 102, $R_{D1}$ 112) corresponds to an identical component on the side of the other output (e.g., $M_2$ 104, $R_{D2}$ 114).

$M_1$ 102 and $M_2$ 104 comprise a differential pair and act to control the distribution of current flowing from $I_{TAIL}$ 106 between $V_{DD}$ 116 and $V_{SS}$ 110. The sum of the current flowing through both $M_1$ 102 and $M_2$ 104 equals $I_{TAIL}$ 106. So, for example, as $v_{i1}$ 118 rises with respect to $v_{i2}$ 120, the portion of the total current of $I_{TAIL}$ 106 that flows through $M_1$ 102 and $R_{D1}$ 112 increases, while the portion that flows through $M_2$ 104 and $R_{D2}$ 114 decreases. More current flowing through $R_{D1}$ 112 increases the drop in voltage across $R_{D1}$ 112, while less current flowing through $R_{D2}$ 114 decreases the drop in voltage across $R_{D2}$ 114. Thus, $v_{o1}$ 122 rises with respect to $v_{o2}$ 124.

The differential input signal can be expressed as shown in Eq. (1):

$$v_{id} = v_{i1} - v_{i2}, \quad \text{Eq. (1)}$$

while the common mode input signal can be expressed as shown in Eq. (2):

$$v_{ic} = [v_{i1} + v_{i2}]/2. \quad \text{Eq. (2)}$$

Likewise, the differential output signal can be expressed as shown in Eq. (3):

$$v_{od} = v_{o1} - v_{o2}, \quad \text{Eq. (3)}$$

while the common mode output signal can be expressed as shown in Eq. (4):

$$v_{oc} = [v_{o1} + v_{o2}]/2. \quad \text{Eq. (4)}$$

As noted above, the purpose of differential amplifier 100 is to sense changes in its differential input signal $V_{id}$ while rejecting changes in its common mode input signal $v_{ic}$. The ability of differential amplifier 100 to realize this goal can be expressed by several figures of merit. Particularly, the common mode rejection ratio, CMRR, is defined as shown in Eq. (5):

$$CMRR = |A_{dm}/A_{cm}|, \quad \text{Eq. (5)}$$

where $A_{dm}$ is the differential mode gain and $A_{cm}$ is the common mode gain. $A_{dm}$ can be expressed as shown in Eq. (6):

$$A_{dm} = v_{od}/v_{id}|_{vic=0} = \tfrac{1}{2}\{[(v_{o1}-v_{o2})/v_{i1}] + [(v_{o2}-v_{o1})/v_{i2}]\}. \quad \text{Eq. (6)}$$

$A_{cm}$ can be expressed as shown in Eq. (7):

$$A_{cm} = v_{oc}/v_{ic}|_{vid=0} = \tfrac{1}{2}\{[(v_{o1}+v_{o2})/v_{i1}] + [(v_{o2}+v_{o1})/v_{i2}]\}. \quad \text{Eq. (7)}$$

In designing differential amplifiers, it is desired to maximize the value of CMRR. This is indicative of maximizing the desired differential mode gain and/or minimizing the undesired common mode gain. Small signal analysis of a differential amplifier can be used to express CMRR as a function of the physical parameters internal to the transistors from which differential amplifier 100 is comprised. The small signal analysis needs to account for both differential mode and common mode operations.

FIG. 2 is a schematic diagram of a small signal model circuit 200 of differential amplifier 100. In circuit 200, $M_1$ 102 is modeled as a current source "$i_1$" 202 connected in parallel with an output resistance "$r_{o1}$" 204 between a node "$N_0$" 206 and a node "$N_1$" 208. An input resistance "$r_{\pi 1}$" 210 is connected in series between $N_0$ 206 and a first input signal "$v_{i3}$" 212. $R_{D1}$ 112 is connected in series between $N_1$ 208 and ground. A first output signal "$v_{o3}$" 214 is produced at $N_1$ 208. Likewise, $M_2$ 104 is modeled as a current source "$i_2$" 216 connected in parallel with an output resistance "$r_{o2}$" 218 between $N_0$ 206 and a node "$N_2$" 220. An input resistance "$r_{\pi 2}$" 222 is connected in series between $N_O$ 206 and a second input signal "$v_{i4}$" 224. A second output signal "$v_{o4}$" 226 is produced at $N_2$ 220. $R_{D2}$ 114 is connected in series between $N_2$ 220 and ground. $R_{TAIL}$ 108 is connected in series between $N_O$ 206 and ground.

The value of $i_1$ 202 can be expressed as shown in Eq. (8):

$$i_1 = g_m v_1,\qquad\text{Eq. (8)}$$

where $g_m$ is the transconductance of $M_1$ 102 (or $M_2$ 104, because differential amplifier 100 is balanced), and $v_1$ is the voltage drop across $r_{\pi 1}$ 210. Likewise, the value of $i_2$ 216 can be expressed as shown in Eq. (9):

$$i_2 = g_m v_2,\qquad\text{Eq. (9)}$$

where $v_2$ is the voltage drop across $r_{\pi 2}$ 222.

In differential mode, the value of $v_{i3}$ 212 can be expressed as shown in Eq. (10):

$$v_{i3} = v_{id}/2,\qquad\text{Eq. (10)}$$

while the value of $v_{i4}$ 224 can be expressed as shown in Eq. (11):

$$v_{i4} = -v_{id}/2.\qquad\text{Eq. (11)}$$

Likewise, the value of $v_{o3}$ 214 can be expressed as shown in Eq. (12):

$$v_{o3} = v_{od}/2,\qquad\text{Eq. (12)}$$

while the value of $v_{o4}$ 226 can be expressed as shown in Eq. (13):

$$v_{o4} = -v_{od}/2.\qquad\text{Eq. (13)}$$

Where $M_1$ 102 and $M_2$ 104 are MOSFETs, input resistances $r_{\pi 1}$ 210 and $r_{\pi 2}$ 222 are sufficiently large as to be considered infinite. Thus, the value of $i_1$ 202 can be expressed as shown in Eq. (14):

$$i_1 = g_m v_{id}/2,\qquad\text{Eq. (14)}$$

and the value of $i_2$ 216 can be expressed as shown in Eq. (15):

$$i_2 = -g_m v_{id}/2.\qquad\text{Eq. (15)}$$

Because differential amplifier 100 is balanced and the input signals are driven by equal but opposite voltages, there is no variation in the voltage across $R_{TAIL}$ 108. In small signal analysis, this condition is effectively the same as connecting $N_O$ 206 to ground. Therefore, further analysis of small signal model circuit 200 operating in differential mode can be simplified by analyzing a small signal differential mode model half circuit.

FIG. 3 is a schematic diagram of a small signal differential mode model half circuit 300. In half circuit 300, $i_1$ 202, $r_{o1}$ 204, and $R_{D1}$ 112 are connected in parallel between $N_O$ 206 and $N_1$ 208. $N_O$ 206 is connected to ground. $v_{o3}$ 214 is produced at $N_1$ 208. Recalling Eqs. (6), (12), and (14), $A_{dm}$ can be expressed as shown in Eq. (16):

$$A_{dm} = -g_m R,\qquad\text{Eq. (16)}$$

where R is the effective resistance of the parallel combination of $r_{o1}$ 204 and $R_{D1}$ 112.

Returning to FIG. 2, in common mode, the values of $v_{i3}$ 212 and $v_{i4}$ 224 can be expressed as shown in Eq. (17):

$$v_{i3} = v_{i4} = v_{ic}.\qquad\text{Eq. (17)}$$

Likewise, the values of $v_{o3}$ 214 and $v_{o4}$ 226 can be expressed as shown in Eq. (18):

$$v_{o3} = v_{o4} = v_{oc}.\qquad\text{Eq. (18)}$$

Where $M_1$ 102 and $M_2$ 104 are MOSFETs, input resistances $r_{\pi 1}$ 210 and $r_{\pi 2}$ 222 are sufficiently large as to be considered infinite. Thus, the values of $i_1$ 202 and $i_2$ 216 can be expressed as shown in Eq. (19):

$$i_1 = i_2 = g_m v_{ic}.\qquad\text{Eq. (19)}$$

Because differential amplifier 100 is balanced and the input signals are driven by equal voltages, further analysis of small signal model circuit 200 operating in common mode can be simplified by analyzing a small signal common mode model half circuit.

FIG. 4 is a schematic diagram of a small signal common mode model half circuit 400. In half circuit 400, a resistor "$R_{TAIL2}$" 402 is connected between $N_O$ 206 and ground. The value of $R_{TAIL2}$ 402 can be expressed as shown in Eq. (20):

$$R_{TAIL2} = 2 \times R_{TAIL}.\qquad\text{Eq. (20)}$$

Conceptually, $R_{TAIL}$ 108 in small signal model circuit 200 is first modeled as a parallel combination of two resistors connected between $N_O$ 206 and ground. Each resistor in the parallel combination has a resistance value equal to $R_{TAIL2}$ 402, such that the resistance value of the parallel combination remains equal to $R_{TAIL}$ 108. This enables small signal model circuit 200 to be reconfigured as small signal common mode model half circuit 400 so that it accounts for the voltage drop across $R_{TAIL}$ 108.

Also in half circuit 400, $i_1$ 202 is connected between $N_O$ 206 and $N_1$ 208 so that $i_1$ 202 and $R_{TAIL2}$ 402 are connected in series between $N_1$ 208 and ground. Additionally, $r_{o1}$ 204 and $R_{D1}$ 112 are connected in parallel between $N_1$ 208 and ground. $v_{o3}$ 214 is produced at $N_1$ 208. Recalling Eqs. (7), (18), (19), and (20), $A_{cm}$ can be expressed as shown in Eq. (21):

$$A_{cm} = -g_m R/[1 + g_m R_{TAIL2}],\qquad\text{Eq. (21)}$$

where R is the effective resistance of the parallel combination of $r_{o1}$ 204 and $R_{D1}$ 112.

Thus, recalling Eqs. (5), (16), and (21), CMRR, as a function of the physical parameters internal to the transistors from which differential amplifier 100 is comprised, can be expressed as shown in Eq. (22):

$$CMRR = 1 + g_m R_{TAIL2}.\qquad\text{Eq. (22)}$$

In practical implementations, differential amplifiers are realized using active devices for current sources, and in most cases also for loads. Active devices provide large values of resistance, while dropping less voltage and consuming less die area than passive resistors.

FIG. 5 is a schematic diagram of a conventional differential amplifier 500 with active loads. Differential amplifier 500 comprises a differential pair 502 of amplifying transistors $M_1$ 102 and $M_2$ 104 with source terminals connected together. A load transistor is connected to the drain terminal of each amplifying transistor. "$M_3$" 504 is connected to the drain terminal of $M_1$ 102; "$M_4$" 506 is connected to the drain terminal of $M_2$ 104. $M_3$ 504 and $M_4$ 506 are together connected to power supply voltage $V_{DD}$ 116. A first bias voltage "$V_{biasp}$" 508 holds load transistors $M_3$ 504 and $M_4$ 506 in saturation. A fifth transistor "$M_5$" 510 provides a current source for differential amplifier 500. $M_5$ 510 is connected between the source terminals of $M_1$ 102 and $M_2$ 104, and power supply voltage $V_{SS}$ 110. A second bias voltage "$V_{biasn}$" 512 holds transistor $M_5$ 510 in saturation.

First input signal $v_{i1}$ 118 is applied to the gate terminal of $M_1$ 102 and first output signal $v_{o1}$ 122 is produced at the drain terminal of $M_2$ 104. Second input signal $v_{i2}$ 120 is applied to the gate terminal of $M_2$ 104 and second output signal $v_{o2}$ 124 is produced at the drain terminal of $M_1$ 102.

In differential amplifier 500, $M_1$ 102, $M_2$ 104, and $M_5$ 510 are NMOSFETs, while $M_3$ 504 and $M_4$ 506 are PMOSFETs. However, one skilled in the art would recognize that other transistor configurations could also be used. Preferably, differential amplifier 500 is balanced such that each component on the side of one output (e.g., $M_1$ 102, $M_3$ 504) corresponds to an identical component on the side of the other output (e.g., $M_2$ 104, $M_4$ 506).

Unfortunately, while the use of active devices for current sources and loads has several advantages, it also presents the problem of limiting the input common mode signal range. (It is desirable to have the input common mode signal range from $V_{SS}$ to $V_{DD}$.) This is due to the need to hold current source transistors in saturation. This common mode confinement is particularly difficult in applications seeking to meet, for example, IEEE Std 1596.3-1996 for Low-Voltage Differential Signals for Scalable Coherent Interface, which requires a large input common mode signal range. An analysis of the input common mode signal range for differential amplifier 500 highlights this limitation.

For differential amplifier 500, the lower limit of vic can be expressed as shown in Eq. (23):

$$v_{ic} > V_{SS} + v_{Tn} + v_{ovM5},  \qquad \text{Eq. (23)}$$

where $v_{Tn}$ is the threshold voltage of $M_1$ 102 (or $M_2$ 104), and $v_{ovM5}$ is the overdrive voltage of $M_5$ 510.

Likewise, the upper limit of $v_{ic}$ can be expressed as shown in Eq. (24):

$$v_{ic} < V_{DD} + v_{Tn} - v_{ovload},  \qquad \text{Eq. (24)}$$

where $v_{ovload}$ is the overdrive voltage of $M_3$ 504 (or $M_4$ 506). Normally, $v_{Tn} > v_{ovload}$. Thus, the analysis shows that, while the upper limit of the input common mode signal range desirably can be maintained greater than or equal to $V_{DD}$, the lower limit of the input common mode signal range undesirably often must be greater than $V_{SS}$.

Conventionally, this problem has been addressed by configuring a differential amplifier to have two differential pairs to increase the input common mode signal range. FIG. 6 is a schematic diagram of a conventional differential amplifier 600 with two differential pairs. Differential amplifier 600 comprises differential pair 502 of amplifying transistors $M_1$ 102 and $M_2$ 104 with source terminals connected together. $M_5$ 510 is connected between $V_{SS}$ 110 and the source terminals of $M_1$ 102 and $M_2$ 104. $V_{biasn}$ 512 holds transistor $M_5$ 510 in saturation.

Differential amplifier 600 further comprises a second differential pair 602 of amplifying transistors "$M_6$" 604 and "$M_7$" 606 with source terminals connected together. A sixth transistor "$M_8$" 608 provides a current source for amplifying transistors $M_6$ 604 and $M_7$ 606. $M_8$ 608 is connected between $V_{DD}$ 116 and the source terminals $M_6$ 604 and $M_7$ 606. A third bias voltage "$V_{biasp2}$" 610 holds transistor $M_8$ 608 in saturation.

First input signal $v_{i1}$ 118 is applied to the gate terminals of both $M_1$ 102 and $M_6$ 604. Second input signal $v_{i2}$ 120 is applied to the gate terminals of both $M_2$ 104 and $M_7$ 606. First output signal $v_{o1}$ 122 is produced at the drain terminal of $M_2$ 104. Second output signal $v_{o2}$ 124 is produced at the drain terminal of $M_1$ 102. A third output signal "$v_{o5}$" 612 is produced at the drain terminal of $M_7$ 606. A fourth output signal "$v_{o6}$" 614 is produced at the drain terminal of $M_6$ 604.

Differential amplifier 600 requires a subsequent stage, usually a cascode structure, to provide loads for amplifying transistors $M_1$ 102, $M_2$ 104, $M_6$ 604, and $M_7$ 606, and to process the four output signals $v_{o1}$ 122, $v_{o2}$ 124, $v_{o5}$ 612, and $v_{o6}$ 614.

In differential amplifier 600, $M_1$ 102, $M_2$ 104, and $M_5$ 510 are NMOSFETs, while $M_6$ 604, $M_7$ 606, and $M_8$ 608 are PMOSFETs. However, one skilled in the art would recognize that other transistor configurations could also be used. Preferably, differential amplifier 600 is balanced such that each component on the side of one output (e.g., $M_1$ 102, $M_6$ 604) corresponds to an identical component on the side of the other output (e.g., $M_2$ 104, $M_7$ 606).

An analysis of the input common mode signal range for differential amplifier 600 shows that it is wider than that of differential amplifier 500. For differential amplifier 600, the lower limit of $v_{ic}$ can be expressed as shown in Eq. (25):

$$v_{ic} > V_{SS} + v_{Tp} + v_{ovloadn},  \qquad \text{Eq. (25)}$$

where $v_{Tp}$ is the threshold voltage of $M_6$ 604 (or $M_7$ 606), and $v_{ovloadn}$ is the overdrive voltage of a NMOSFET load in the subsequent stage (not shown). Normally, $v_{Tp} < 0$, but $|v_{Tp}| > |v_{ovloadn}|$.

Likewise, the upper limit of $V_{ic}$ can be expressed as shown in Eq. (26):

$$v_{ic} < V_{DD} + v_{Tn} - v_{ovloadp},  \qquad \text{Eq. (26)}$$

where $v_{ovloadp}$ is the overdrive voltage of a PMOSFET load in the subsequent stage (not shown). Thus, when $v_{ovloadn} = v_{ovM5}$ and $v_{ovloadp} = v_{ovload}$, comparisons of Eq. (23) with Eq. (25), and Eq. (24) with Eq. (26) show that the upper limit of the input common mode signal range desirably can be maintained greater than or equal to $V_{DD}$, and the lower limit of the input common mode signal range desirably can also be maintained less than or equal to $V_{SS}$.

However, while differential amplifier 600 maximizes the input common mode signal range, the design presents several problems that detract from its usefulness. Significant power is dissipated and valuable substrate area is consumed to support the second current source transistor and to support the subsequent stage needed to provide loads for the amplifying transistors and to process the two additional output signals. Also, successful implementation of differential amplifier 600 depends on an ability to fabricate differential pairs 502 and 602 with matching gains and similar transient behaviors. This is very difficult to realize when differential pair 502 comprises NMOSFETs and differential pair 602 comprises PMOSFETs.

What is needed is a differential amplifier design that optimizes the input common mode signal range, power dissipated, and substrate area consumed, and avoids the difficulty of matching gains between a differential pair of NMOSFETs and a differential pair of PMOSFETs.

BRIEF SUMMARY OF THE INVENTION

The present invention relates to a method of extending an input signal range of a component that receives the input signal. Specifically, the present invention relates to a design for an amplifier that extends its input signal range. More specifically, the present invention relates to a design for a differential amplifier with a large input common mode signal range.

The differential amplifier of the present invention comprises two differential pairs Each differential pair comprises two amplifying MOSFETs with their source terminals connected together. The drain terminals of corresponding amplifying MOSFETs in each differential pair are also connected together and to the drain terminal of a corresponding load MOSFET. The amplifying MOSFETs are of the same type: either NMOSFETs or PMOSFETs. The load MOSFETs are of the type opposite that of the amplifying MOSFETs.

A bias voltage holds the load MOSFETs in saturation. The bias voltage has the effect of limiting the voltages of an input common mode signal to a range less than the desirable voltage range. The desirable voltage range spans between the voltages that supply power to the amplifier.

A source follower is connected to the gate terminal of each amplifying MOSFET in one of the differential pairs. Each source follower comprises a driven MOSFET and a non-driven MOSFET. They are of the type opposite that of the amplifying MOSFETs. The source terminal of each driven MOSFET and the drain terminal of the corresponding non-driven MOSFET are connected to the gate terminal of the corresponding amplifying MOSFET. An input signal is applied at two terminals in each half of the differential amplifier: the gate terminal of the driven MOSFET of the source follower and the gate terminal of the amplifying MOSFET not connected to the source follower. The source follower acts to offset the voltage of the input signal to compensate for the range loss due to the bias voltage.

The differential amplifier further comprises a pair of switch MOSFETs with their source terminals connected together and to a current source MOSFET. Another bias voltage holds the current source MOSFET in saturation. The drain terminal of one of the switch MOSFETs is connected to the source terminals of the amplifying MOSFETs in the differential pair driven by the source followers. A reference voltage is applied to the gate terminal of this switch MOSFET. The drain terminal of the other switch MOSFET is connected to the source terminals of the amplifying MOSFETs in the other differential pair. An input common mode signal is applied to the gate terminal of this switch MOSFET. The other bias voltage and the threshold voltages of the switch MOSFETs also have the effect of limiting the voltages of the input common mode signal to a range less than the desirable voltage range.

The switch MOSFETs act to control the distribution of the total current flowing from the current source MOSFET. So, for example, when the input common mode signal voltage equals the reference voltage, equal portions of the total current flow through both switch MOSFETs; when the input common mode signal voltage is greater than the reference voltage, a greater portion of the total current flows through the MOSFET switch tied to the differential pair directly driven by the input signals; and when the input common mode signal voltage is less than the reference voltage, a greater portion of the total current flows through the MOSFET switch tied to the differential pair driven by the source followers.

A differential input signal applied to the differential amplifier comprises two separate signals. Each separate signal is applied to the gate terminals of both the amplifying MOSFET in the differential pair not driven by the source follower and the driven MOSFET of the source follower. Each source follower acts to offset the voltage of its input signal to compensate for the range loss due to the bias voltages and the threshold voltages of the switch MOSFETs.

When equal portions of the total current flow through both switch MOSFETs, both differential pairs work equally to amplify the input signals; when a greater portion of the total current flows through the MOSFET switch tied to the differential pair directly driven by the input signals, that differential pair works dominantly; when a greater portion of the total current flows through the MOSFET switch tied to the differential pair driven by the source followers, that differential pair works dominantly.

Advantageously, the differential amplifier optimizes its input common mode signal range using differential pairs of the same type. This mitigates difficulties faced in fabricating differential pairs with matching gains and similar transient behaviors.

Furthermore, the differential amplifier does not require a subsequent stage to provide loads for its amplifying MOSFETs or to process additional output signals. Thus, it consumes both less power and less substrate area. Additional savings in power and substrate area are realized because the differential pairs both draw current from the same current source MOSFET.

Yet another advantage provided by the design of the differential amplifier is a larger common mode rejection ratio because the switch MOSFETs are connected in a cascode configuration and act to maintain the total current more constant over the input common mode voltage range.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 8 is a schematic diagram of a small signal model circuit 800 of differential pair 502 of differential amplifier 700.

FIG. 9 is a schematic diagram of a circuit 900 for obtaining vic 736 from $v_{i1}$ 118 and $v_{i2}$ 120.

The preferred embodiments of the invention are described with reference to the figures where like reference numbers indicate identical or functionally similar elements. Also in the figures, the left most digit of each reference number identifies the figure in which the reference number is first used.

DETAILED DESCRIPTION OF THE INVENTION

The present invention relates to a method of extending an input signal range of a component that receives the input signal. Specifically, the present invention relates to a design for an amplifier that extends its input signal range. More specifically, the present invention relates to a design for a differential amplifier with a large input common mode signal range.

Figure 7:
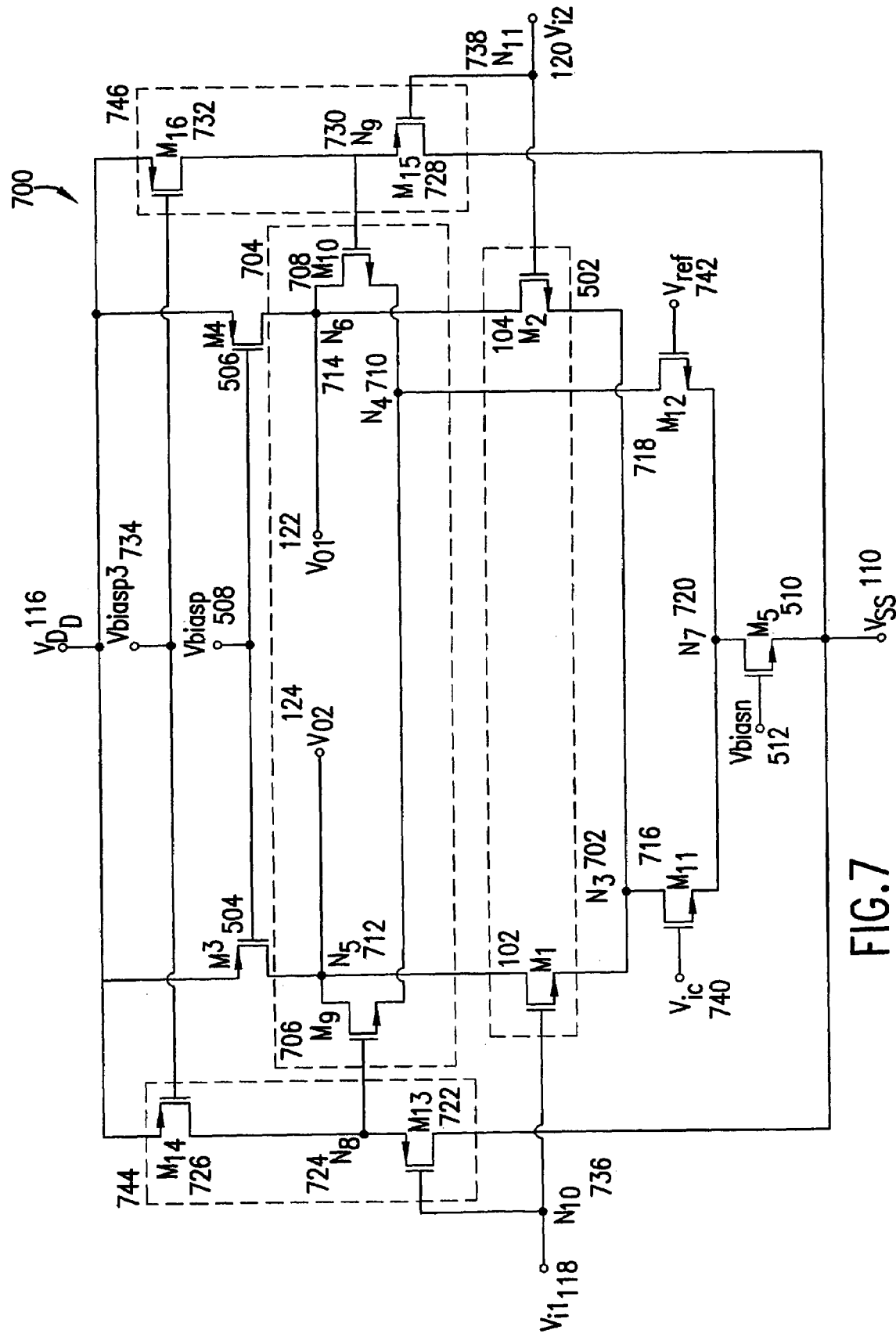
FIG. 7 is a schematic diagram of a differential amplifier 700 configured to be a NMOSFET embodiment of the present invention.

FIG. 7 is a schematic diagram of a differential amplifier 700 configured to be a NMOSFET embodiment of the present invention. Differential amplifier 700 comprises first differential pair 502 of amplifying NMOSFETs $M_1$ 102 and $M_2$ 104 with source terminals connected at a first node "$N_3$" 702, and a second differential pair 704 of amplifying NMOSFETs "$M_9$" 706 and "$M_{10}$" 708 with source terminals connected at a second node "$N_4$" 710. First and second differential pairs 502, 704 are connected in parallel. The drain terminals of $M_1$ 102 and $M_9$ 706 are connected at a third node "$N_5$" 712; the drain terminals of $M_2$ 104 and $M_{10}$ 708 are connected at a fourth node "$N_6$" 714. $M_3$ 504 is connected as a load PMOSFET between $V_{DD}$ 116 and $N_5$ 712; $M_4$ 506 is connected as a load PMOSFET between $V_{DD}$ 116 and $N_6$ 714. First bias voltage $V_{biasp}$ 508 holds $M_3$ 504 and $M_4$ 506 in saturation.

A first switch NMOSFET "$M_{11}$" 716 and a second switch NMOSFET "$M_{12}$" 718 have their source terminals connected at a fifth node "$N_7$" 720. The drain terminal of $M_{11}$ 716 is connected to $N_3$ 702; the drain terminal of $M_{12}$ 718 is connected to $N_4$ 710. $M_{11}$ 716 and $M_{12}$ 718 together comprise a differential switch circuit. Current source NMOSFET $M_5$ 510 is connected between $V_{SS}$ 110 and $N_7$ 720. Second bias voltage $V_{biasn}$ 512 holds $M_5$ 510 in saturation.

The source terminal of a first voltage offset PMOSFET "$M_{13}$" 722 is connected with the gate terminal of $M_9$ 706 at a sixth node "$N_8$" 724. The drain terminal of $M_{13}$ 722 is connected to $V_{SS}$ 110. A second current source PMOSFET "$M_{14}$" 726 is connected between $V_{DD}$ 116 and $N_8$ 724. The source terminal of a second voltage offset PMOSFET "$M_{15}$" 728 is connected with the gate terminal of $M_{10}$ 708 at a seventh node "$N_9$" 730. The drain terminal of $M_{15}$ 728 is connected to $V_{SS}$ 110. A third current source PMOSFET "$M_{16}$" 732 is connected between $V_{DD}$ 116 and $N_9$ 730. A third bias voltage "$V_{biasp3}$" 734 holds both $M_{14}$ 726 and $M_{16}$ 732 in saturation.

First input signal $v_{i1}$ 118 is applied to the gate terminals of both $M_1$ 102 and $M_{13}$ 722 at a first input terminal "$N_{10}$" 736; second input signal $v_{i2}$ 120 is applied to the gate terminals of both $M_2$ 104 and $M_{15}$ 730 at a second input terminal "$N_{11}$" 738. $N_{10}$ 736 and $N_{11}$ 738 together comprise a differential input. First output signal $v_{o1}$ 122 is produced at $N_6$ 714, which is a first output terminal; second output signal $v_{o2}$ 124 is produced at $N_5$ 712, which is a second output terminal. $N_6$ 714 and $N_5$ 712 together comprise a differential output. An input common mode signal (see Eq. (2)) "$v_{ic}$" 747 is applied to the gate terminal of $M_{11}$ 716; a reference voltage "$V_{ref}$" 742 is applied to the gate terminal of $M_{12}$ 718.

Preferably, differential amplifier 700 is balanced such that each component on the side of one output (e.g., $M_1$ 102, $M_3$ 504, $M_9$ 706, $M_{11}$ 716, $M_{13}$ 722, $M_{14}$ 726) corresponds to an identical component on the side of the other output (e.g., $M_2$ 104, $M_4$ 506, $M_{10}$ 708, $M_{12}$ 718, $M_{15}$ 728, $M_{16}$ 732).

Configured as they are, $M_{13}$ 722 and $M_{14}$ 726 form a first source follower 744, where $M_{13}$ 722 is the driven PMOSFET and $M_{14}$ 726 is the non-driven PMOSFET. Thus, the voltage at $N_8$ 724, $v_{N8}$, can be expressed as shown in Eq. (27):

$$v_{N8} = v_{i1} - V_{TpM13} + v_{ovM13}, \quad \text{Eq. (27)}$$

where $V_{TpM13}$ is the threshold voltage of $M_{13}$, and $v_{ovM13}$ is the overdrive voltage of $M_{13}$. Likewise, $M_{15}$ 728 and $M_{16}$ 732 form a second source follower 746, where $M_{15}$ 728 is the driven PMOSFET and $M_{16}$ 732 is the non-driven PMOSFET. Thus, the voltage at $N_9$ 730, $v_{N9}$, can be expressed as shown in Eq. (28):

$$v_{N9} = v_{i2} - V_{TpM15} + v_{ovM15}, \quad \text{Eq. (28)}$$

where $v_{TpM15}$ is the threshold voltage of $M_{15}$, and $v_{ovM15}$ is the overdrive voltage of $M_{15}$. Normally, $v_{TpM13} < 0$, and $v_{TpM15} < 0$. Thus, $M_{13}$ 722 and $M_{15}$ 728 act to level shift, respectively, $v_{i1}$ 118 and $v_{i2}$ 120, by the sum of the absolute values of the threshold and overdrive voltages of $M_{13}$ 722 (or equivalently, $M_{15}$ 728). First and second source followers 744, 746 together comprise a differential offset circuit.

First differential pair 502 directly amplifies $v_{i1}$ and $v_{i2}$, while second differential pair 704 amplifies $v_{N8}$ and $v_{N9}$. Hence, second differential pair 704 indirectly amplifies $v_{i1}$ and $v_{i2}$ because of the voltage drop across $M_{13}$ 722 and $M_{15}$ 728. Based on the instantaneous value of $v_{ic}$ 736, $M_{11}$ 716 and $M_{12}$ 718 act to control which of first and second differential pairs 502, 704 dominates the other during amplification. The effect of this arrangement is that each differential pair 502, 704 has its own corresponding input common mode signal range such that the overall input common mode signal range of differential amplifier 700 is improved. For example, first differential pair 502 dominates over a first input common mode signal range, and second differential pair 704 dominates over a second input common mode signal range.

$M_{11}$ 716 controls a first current flow to first differential pair 502 based on $v_{ic}$ 740. Likewise, $M_{12}$ 718 controls a second current flow to second differential pair 704. Therefore, $M_{11}$ 716 and $M_{12}$ 718 determine the respective gain of differential pairs 502, 704. The sum of current flowing through both $M_{11}$ 716 and $M_{12}$ 718 equals the total current flowing through $M_5$ 510. So, for example, when $v_{ic}$ 740 equals $v_{ref}$ 742, equal portions of the total current flow through $M_{11}$ 716 and $M_{12}$ 718; when $v_{ic}$ 740 is greater than $v_{ref}$ 742, a greater portion of the total current flows through $M_{11}$ 716; and when $v_{ic}$ 740 is less than $v_{ref}$ 742, a greater portion of the total current flows through $M_{12}$ 718.

When equal portions of the total current flow through both $M_{11}$ 716 and $M_{12}$ 718, both differential pairs 502, 704 provide equal amplification for $v_{i1}$ and $v_{i2}$. When a greater portion of the total current flows through $M_{11}$ 716, first differential pair 502 provides more amplification than second differential pair 704. When a greater portion of the total current flows through $M_{12}$ 718, second differential pair 704 provides more amplification than first differential pair 502.

In an embodiment, $v_{ref}$ 740 is set at a voltage level greater than the lower limit of the input common mode signal range of differential pair 502. However, the skilled artisan would recognize other voltage levels to which $v_{ref}$ 740 could be set.

An analysis of the input common mode signal range for differential amplifier 700 shows that it is wider than that of differential amplifier 500. For differential amplifier 700, the lower limit of $v_{ic}$ can be expressed as shown in Eq. (29):

$$v_{ic} > V_{SS} + V_{Tn2} + v_{ovM5} + v_{dsM12} - v_{poffset}, \quad \text{Eq. (29)}$$

where $v_{Tn2}$ is the threshold voltage of $M_9$ 706 (or $M_{10}$ 708), $v_{ovM5}$ is the overdrive voltage of $M_5$ 510, $v_{dsM12}$ is the drain-to-source voltage of $M_{12}$ 718, and $v_{poffset}$ is the sum of the absolute values of the threshold and overdrive voltages of $M_{13}$ 722 (or $M_{15}$ 728). $M_{12}$ 718 works in the linear region as a switch. It is possible that $v_{poffset} > v_{Tn2} + v_{ovM5} + v_{dsM12}$.

Likewise, the upper limit of $v_{ic}$ can be expressed as shown in Eq. (30):

$$v_{ic} < V_{DD} + v_{Tn} - v_{ovload}, \qquad \text{Eq. (30)}$$

where $v_{Tn}$ is the threshold voltage of $M_1$ 102 (or $M_2$ 104), and $v_{ovload}$ is the overdrive voltage of $M_3$ 504 (or $M_4$ 506). By comparing Eq. (23) with Eq. (29), it can be seen that the upper limit of the input common mode signal range desirably can be maintained greater than or equal to $V_{DD}$. Similarly, by comparing Eq. (24) with Eq. (30), it can be seen that the lower limit of the input common mode signal range desirably can be maintained less than or equal to $V_{SS}$.

Advantageously, differential amplifier 700 optimizes its input common mode signal range using differential pairs of NMOSFETs. This mitigates difficulties faced in fabricating differential pairs with matching gains and similar transient behaviors.

Also, unlike differential amplifier 600, differential amplifier 700 does not require a subsequent stage to provide loads for its amplifying transistors or to process additional output signals. Thus, in comparison with differential amplifier 600, differential amplifier 700 consumes both less power and less substrate area.

Further savings in power and substrate area are realized because differential pairs 502, 704 both draw current from current source transistor $M_5$ 510. While differential amplifier 700 does include current source transistors $M_{14}$ 726 and $M_{16}$ 732, these devices are sized at an order of magnitude (about ten times) smaller than that of current source transistor $M_8$ 608 in differential amplifier 600. Therefore, when corresponding devices of differential amplifiers 600 and 700 are similarly sized, differential amplifier 700 consumes less power and occupies less substrate area.

Figure 1:
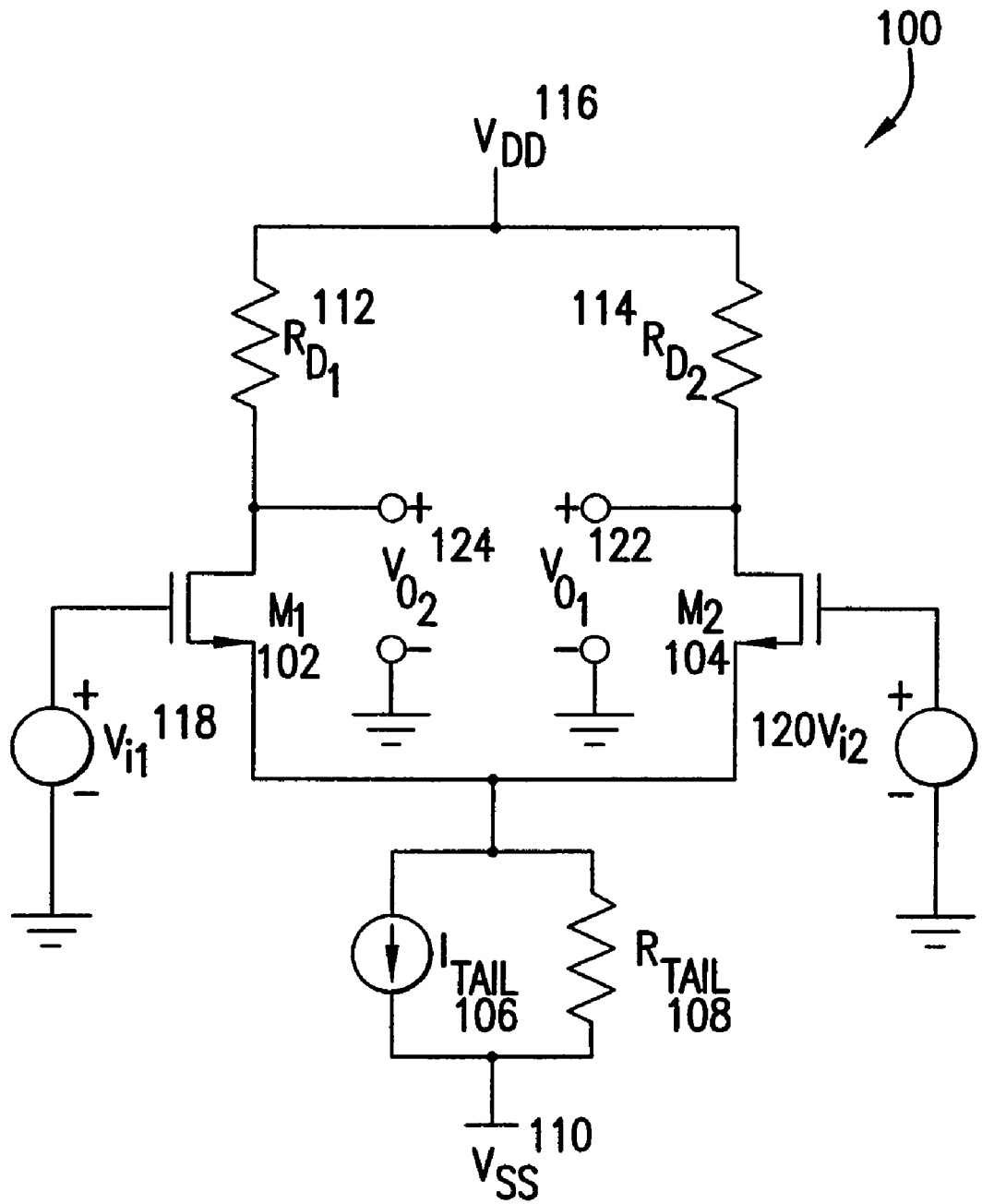
FIG. 1 is a schematic diagram of a conventional differential amplifier 100.
Figure 2:
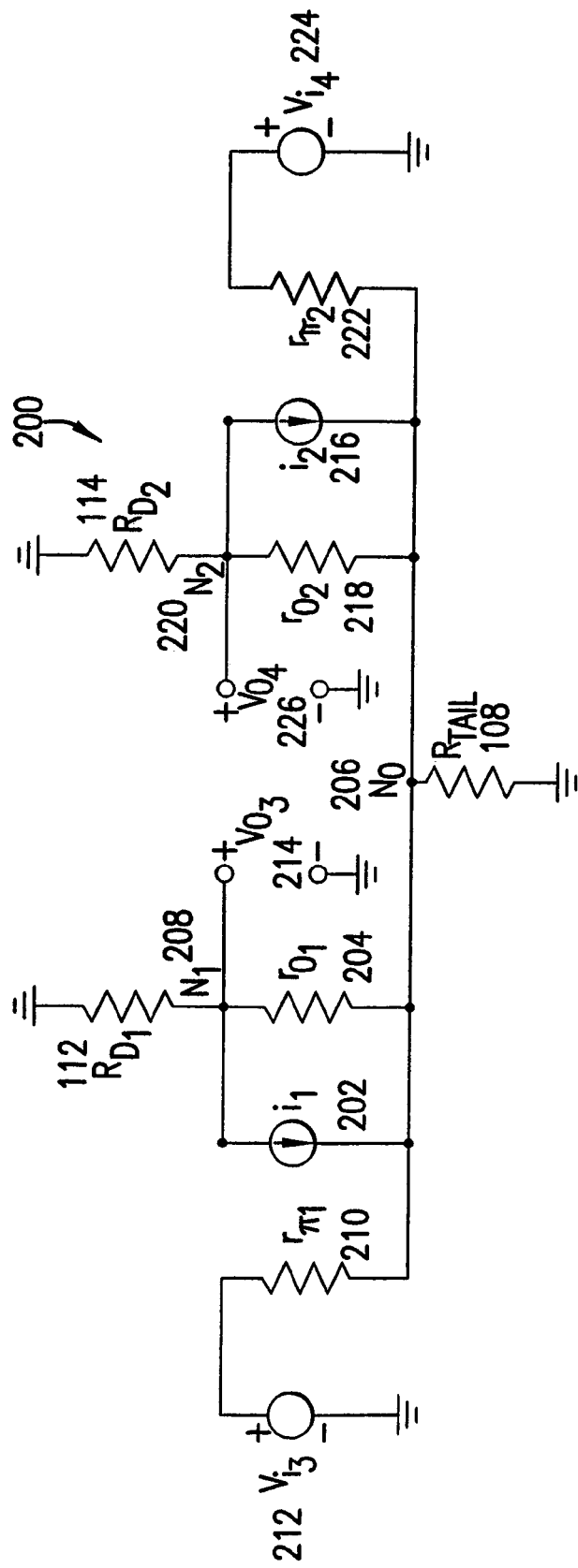
FIG. 2 is a schematic diagram of a small signal model circuit 200 of differential amplifier 100.
Figure 3:
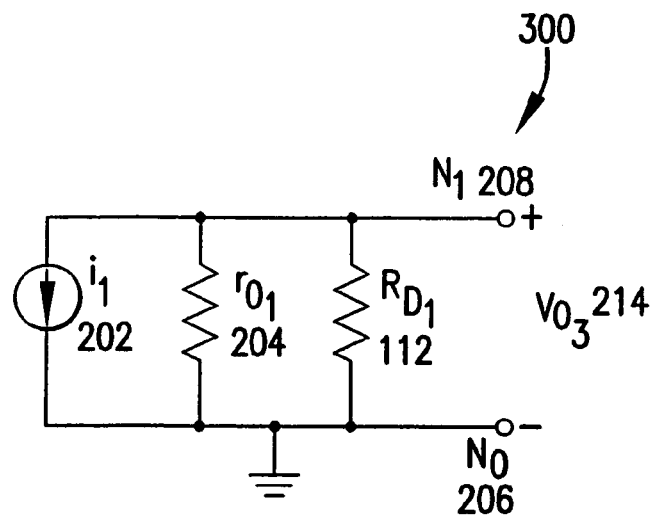
FIG. 3 is a schematic diagram of a small signal differential mode model half circuit 300.
Figure 4:
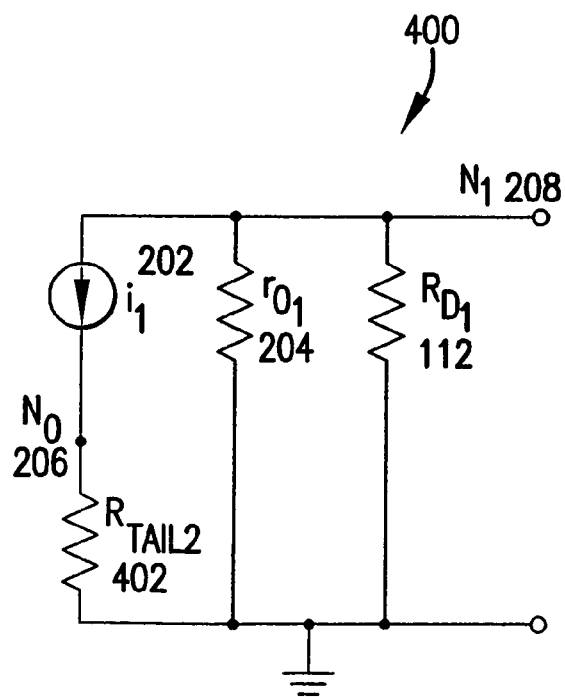
FIG. 4 is a schematic diagram of a small signal common mode model half circuit 400.
Figure 5:
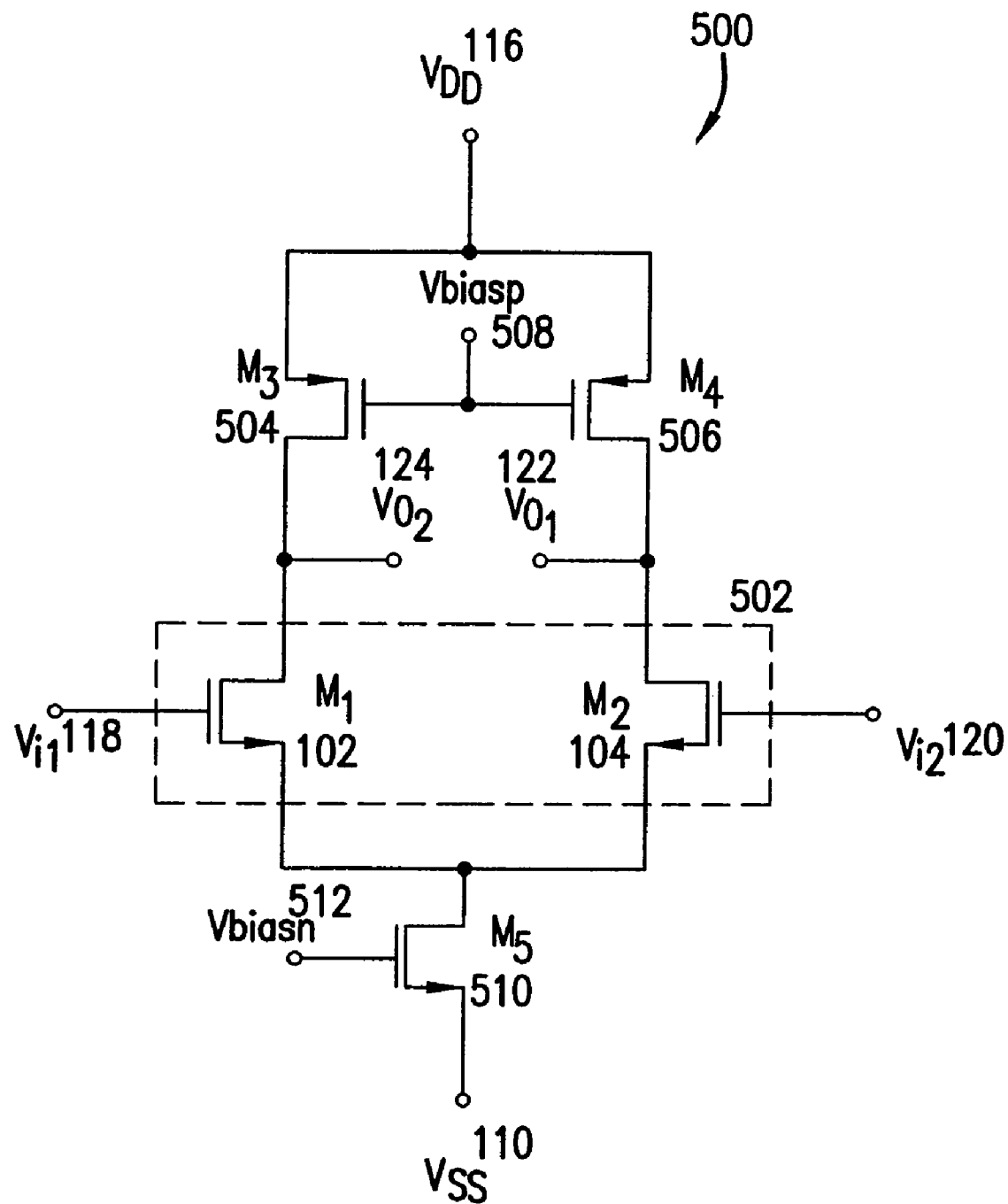
FIG. 5 is a schematic diagram of a conventional differential amplifier 500 with active loads.
Figure 6:
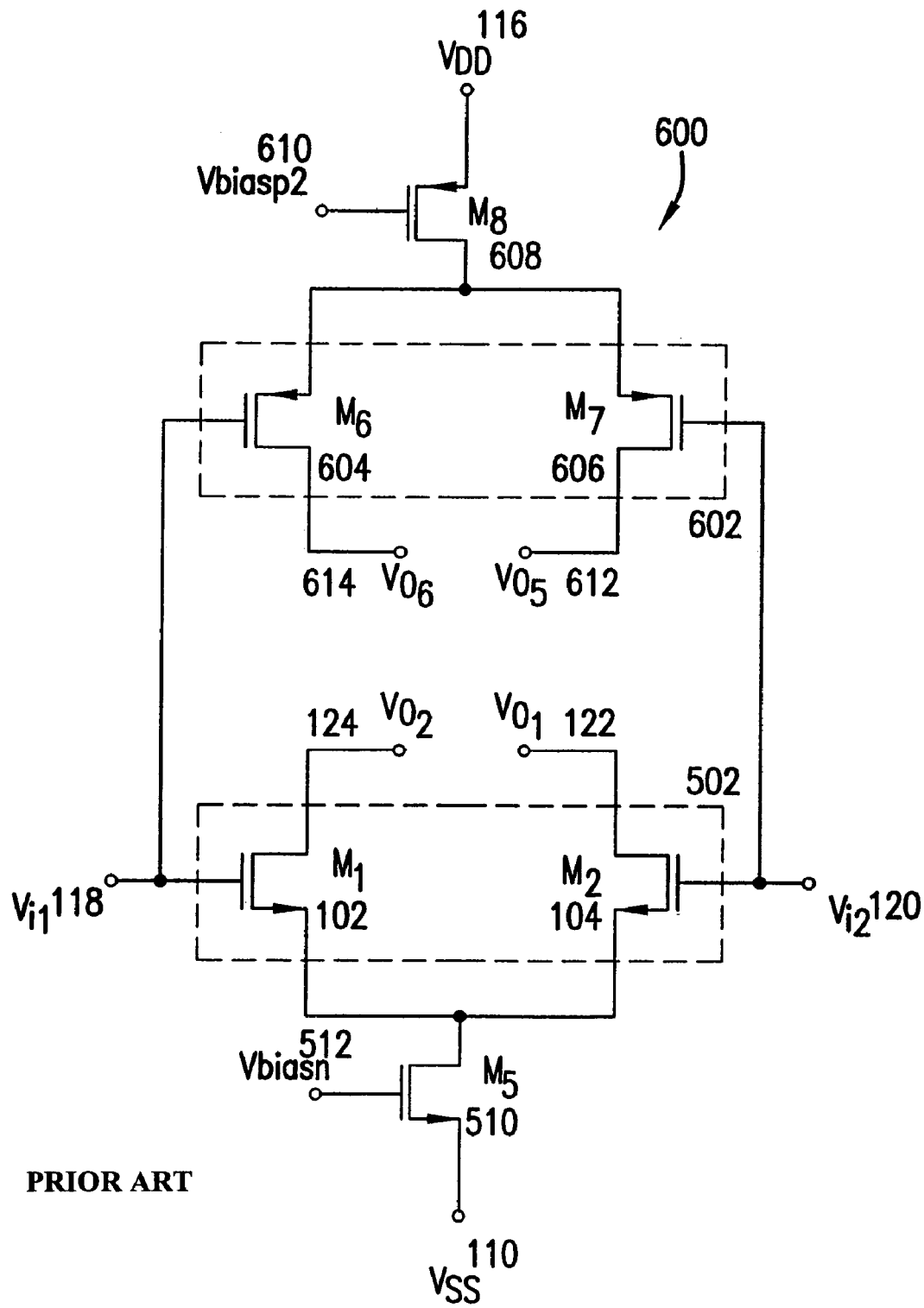
FIG. 6 is a schematic diagram of a conventional differential amplifier 600 with two differential pairs.

Yet another advantage provided by the design of differential amplifier 700, in comparison with differential amplifier 600, is a larger CMRR. Recalling that the CMRR of differential amplifier 100 was derived through analysis of small signal model circuit 200 in FIG. 2, a similar analysis can be performed on a small signal model circuit for differential amplifier 700 to derive its CMRR.

FIG. 8 is a schematic diagram of a small signal model circuit 800 of differential pair 502 of differential amplifier 700. Because differential pair 502 includes amplifying transistors $M_1$ 102 and $M_2$ 104, which are common to differential amplifiers 100, 600, and 700, small signal model circuit 800 is similar to the topology of small signal model circuit 200 with some differences as explained below.

While differential amplifier 100 uses resistors $R_{D1}$ 112 and $R_{D2}$ 114 for passive loads, differential amplifier 700 uses transistors $M_3$ 504 and $M_4$ 506 for active loads. Thus, $R_{D1}$ 112 in circuit 200 is replaced in circuit 800 by a resistor "$r_{OM3}$" 802, which corresponds to the output resistance of $M_3$ 504. Likewise, $R_{D2}$ 114 in circuit 200 is replaced in circuit 800 by a resistor "$r_{OM4}$" 804, which corresponds to the output resistance of $M_4$ 506. A small signal model circuit for differential amplifier 600 (not shown) would include a similar replacement.

Similarly, while differential amplifier 100 uses (ideal) current source $I_{TAIL}$ 106 connected in parallel with resistor $R_{TAIL}$ 108, differential pair 502 (in both differential amplifiers 600 and 700) uses current source transistor $M_5$ 510. Thus, $R_{TAIL}$ 108 in circuit 200 is replaced in circuit 800 by a resistor "$r_{OM5}$" 806, which corresponds to the output resistance of $M_5$ 510.

However, unlike differential amplifiers 100 or 600, differential amplifier 700 also includes switch transistors $M_{11}$ 716 and $M_{12}$ 718. Therefore, circuit 800 also includes a resistor "$r_{OM11}$" 808, which corresponds to the output resistance of $M_{11}$ 716, connected in series with $r_{OM5}$ 806 between $N_0$ 206 and ground.

So, while analysis of small signal model circuit 200 yielded Eq. (22) as an expression for the CMRR of differential amplifiers 100 and 600, a parallel analysis of small signal model circuit 800 shows that the CMRR of differential pair 502 of differential amplifier 700 can be expressed as shown in Eq. (31):

$$CMRR = [1 + 2g_m \times (r_{OM5} + r_{OM11})]. \qquad \text{Eq. (31)}$$

A similar analysis of differential pair 704 shows that its CMRR can be expressed as shown in Eq. (32):

$$CMRR = [1 + 2g_m \times (r_{OM5} + r_{OM12})], \qquad \text{Eq. (32)}$$

where $r_{OM12}$ is the output resistance of $M_{12}$ 718. (Normally, $r_{OM11} = r_{OM12}$.) Thus, the CMRR of differential amplifier 700 is larger than that of differential amplifiers 100 or 600, when $(r_{OM5} + r_{OM12}) > R_{TAIL}$.

FIG. 9 is a schematic diagram of a circuit 900 for obtaining $v_{ic}$ 740 from $v_{i1}$ 118 and $v_{i2}$ 120. In circuit 900, a first division resistor "$R_{div1}$" 902 is connected in series between a first node "$N_{12}$" 904 and a second node "$N_{13}$" 906. A second division resistor "$R_{div2}$" 908 is connected in series between $N_{13}$ 906 and a third node "$N_{14}$" 910. The resistance of $R_{div1}$ equals the resistance of $R_{div2}$. First input signal $v_{i1}$ 118 is applied to $N_{12}$ 904; second input signal $v_{i2}$ 120 is applied to $N_{14}$ 910. Input common mode signal $v_{ic}$ 740 is produced at $N_{13}$ 906. One skilled in the art would recognize other means by which $v_{ic}$ 740 could be obtained from $v_{i1}$ 118 and $v_{i2}$ 120. The present invention is not limited to use of circuit 900.

Figure 10:
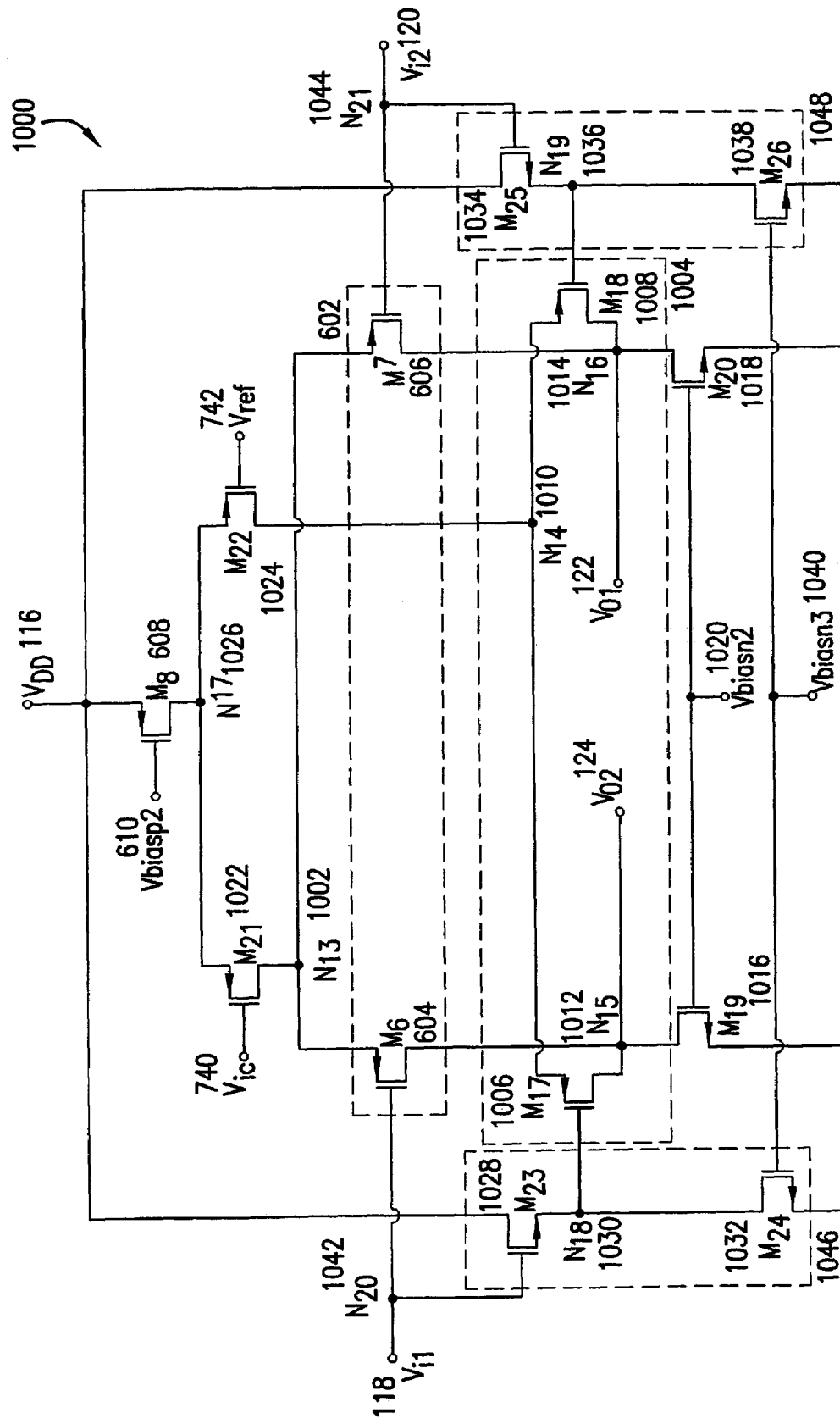
FIG. 10 is a schematic diagram of a differential amplifier 1000 configured to be a PMOSFET embodiment of the present invention.

FIG. 10 is a schematic diagram of a differential amplifier 1000 configured to be a PMOSFET embodiment of the present invention. Differential amplifier 1000 comprises first differential pair 602 of amplifying PMOSFETs $M_6$ 604 and $M_7$ 606 with source terminals connected at a first node "$N_{13}$" 1002, and a second differential pair 1004 of amplifying PMOSFETs "$M_{17}$" 1006 and "$M_{18}$" 1008 with source terminals connected at a second node "$N_{14}$" 1010. First and second differential pairs 602, 1004 are connected in parallel. The drain terminals of $M_6$ 604 and $M_{17}$ 1006 are connected at a third node "$N_{15}$" 1012; the drain terminals of $M_7$ 606 and $M_{18}$ 1008 are connected at a fourth node "$N_{16}$" 1014. A first load transistor "$M_{19}$" 1016 is connected as a load NMOSFET between $V_{SS}$ 110 and $N_{15}$ 1012; a second load transistor "$M_{20}$" 1018 is connected as a load NMOSFET between $V_{SS}$ 110 and $N_{16}$ 1014. A first bias voltage "$V_{biasn2}$" 1020 holds $M_{19}$ 1016 and $M_{20}$ 1018 in saturation.

A first switch PMOSFET "$M_{21}$" 1022 and a second switch PMOSFET "$M_{22}$" 1024 have their source terminals connected at a fifth node "$N_{17}$" 1026. The drain terminal of $M_{21}$ 1022 is connected to $N_{13}$ 1002; the drain terminal of $M_{22}$ 1024 is connected to $N_{14}$ 1010. $M_{21}$ 1022 and $M_{22}$ 1024 together comprise a differential switch circuit. Current source PMOSFET $M_8$ 608 is connected between $V_{DD}$ 116 and $N_{17}$ 1026. Second bias voltage $V_{biasp2}$ 610 holds $M_8$ 608 in saturation.

The source terminal of a first voltage offset NMOSFET "$M_{23}$" 1028 is connected with the gate terminal of $M_{17}$ 1006 at a sixth node "$N_{18}$" 1030. The drain terminal of $M_{23}$ 1028 is connected to $V_{DD}$ 116. A second current source NMOSFET "$M_{24}$" 1032 is connected between $V_{SS}$ 110 and $N_{18}$ 1030. The source terminal of a second voltage offset NMOSFET "$M_{25}$" 1034 is connected with the gate terminal of $M_{18}$ 1008 at a seventh node "$N_{19}$" 1036. The drain terminal of $M_{25}$ 1034 is connected to $V_{DD}$ 116. A third current source NMOSFET "$M_{26}$" 1038 is connected between $V_{SS}$ 110 and $N_{19}$ 1036. A third bias voltage "$V_{biasn3}$" 1040 holds both $M_{24}$ 1032 and $M_{26}$ 1038 in saturation.

First input signal $v_{i1}$ 118 is applied to the gate terminals of both $M_6$ 604 and $M_{17}$ 1006 at a first input terminal "$N_{20}$" 1042; second input signal $v_{i2}$ 120 is applied to the gate terminals of both $M_7$ 606 and $M_{18}$ 1008 at a second input terminal "$N_{21}$" 1044. $N_{20}$ 1042 and $N_{21}$ 1044 together comprise a differential input. First output signal $v_{o1}$ 122 is produced at $N_{16}$ 1014, which is a first output terminal; second output signal $v_{o2}$ 124 is produced at $N_{15}$ 1012, which is a second output terminal. $N_{16}$ 1014 and $N_{15}$ 1012 together comprise a differential output. Input common mode signal (see Eq. (2)) $v_{ic}$ 740 is applied to the gate terminal of $M_{21}$ 1022; reference voltage $v_{ref}$ 742 is applied to the gate terminal of $M_{22}$ 1024.

Preferably, differential amplifier 1000 is balanced such that each component on the side of one output (e.g., $M_6$ 604, $M_{17}$ 1006, $M_{19}$ 1016, $M_{21}$ 1022, $M_{23}$ 1028, $M_{24}$ 1032) corresponds to an identical component on the side of the other output (e.g., $M_7$ 606, $M_{18}$ 1008, $M_{20}$ 1018, $M_{22}$ 1024, $M_{25}$ 1034, $M_{26}$ 1038).

Configured as they are, $M_{23}$ 1028 and $M_{24}$ 1032 form a first source follower 1046, where $M_{23}$ 1028 is the driven NMOSFET and $M_{24}$ 1032 is the non-driven NMOSFET. Thus, the voltage at $N_{18}$ 1030, $v_{N18}$, can be expressed as shown in Eq. (33):

$$v_{N18} = v_{i1} - v_{TnM23} - v_{ovM23},\qquad\text{Eq. (33)}$$

where $v_{TnM23}$ is the threshold voltage of $M_{23}$, and $v_{ovM23}$ is the overdrive voltage of $M_{23}$. Likewise, $M_{25}$ 1034 and $M_{26}$ 1038 form a second source follower 1048, where $M_{25}$ 1034 is the driven NMOSFET and $M_{26}$ 1038 is the non-driven NMOSFET. Thus, the voltage at $N_{19}$ 1036, $v_{N19}$, can be expressed as shown in Eq. (34):

$$v_{N19} = v_{i2} - v_{TnM25} - v_{ovM25},\qquad\text{Eq. (34)}$$

where $v_{TnM25}$ is the threshold voltage of $M_{25}$, and $v_{ovM25}$ is the overdrive voltage of $M_{25}$. Thus, $M_{23}$ 1028 and $M_{25}$ 1034 act to level shift, respectively, $v_{i1}$ 118 and $v_{i2}$ 120, the sum of the absolute values of the threshold and overdrive voltages of $M_{23}$ 1028 (or equivalently, $M_{25}$ 1034). First and second source followers 1046, 1048 together comprise a differential offset circuit.

First differential pair 602 directly amplifies $v_{i1}$ and $v_{i2}$, while second differential pair 1004 amplifies $v_{N18}$ and $v_{N19}$. Hence, second differential pair 1004 indirectly amplifies $v_{i1}$ and $v_{i2}$ because of the voltage drop across $M_{23}$ 1028 and $M_{25}$ 1034. Based on the instantaneous value of $v_{ic}$ 736, $M_{21}$ 1022 and $M_{22}$ 1024 act to control which of first and second differential pairs 602, 1004 dominates the other during amplification. The effect of this arrangement is that each differential pair 602, 1004 has its own corresponding input common mode signal range such that the overall input common mode signal range of differential amplifier 1000 is improved. For example, first differential pair 602 dominates over a first input common mode signal range, and second differential pair 1004 dominates over a second input common mode signal range.

$M_{21}$ 1022 controls a first current flow to first differential pair 602 based on $v_{ic}$ 740. Likewise, $M_{22}$ 1024 controls a second current flow to second differential pair 1004. Therefore, $M_{21}$ 1022 and $M_{22}$ 1024 determine the respective gain of differential pairs 602, 1004. The sum of current flowing through both $M_{21}$ 1022 and $M_{22}$ 1024 equals the total current flowing through $M_8$ 608. So, for example, when $v_{ic}$ 740 equals $v_{ref}$ 742, equal portions of the total current flow through $M_{21}$ 1022 and $M_{22}$ 1024; when $v_{ic}$ 740 is less than $v_{ref}$ 742, a greater portion of the total current flows through $M_{21}$ 1022; and when $v_{ic}$ 740 is greater than $v_{ref}$ 742, a greater portion of the total current flows through $M_{22}$ 1024.

When equal portions of the total current flow through both $M_{21}$ 1022 and $M_{22}$ 1024, both differential pairs 602, 1004 provide equal amplification for $v_{i1}$ and $v_{i2}$. When a greater portion of the total current flows through $M_{21}$ 1022, first differential pair 602 provides more amplification than second differential pair 1004. When a greater portion of the total current flows through $M_{22}$ 1024, second differential pair 1004 provides more amplification than first differential pair 502.

In an embodiment, $v_{ref}$ 740 is set at a voltage level lesser than the upper limit of the input common mode signal range of differential pair 602. However, the skilled artisan would recognize other voltage levels to which $v_{ref}$ 740 could be set.

An analysis of the input common mode signal range for differential amplifier 1000 shows that it is wider than that of differential amplifier 500. For differential amplifier 1000, the lower limit of $v_{ic}$ can be expressed as shown in Eq. (35):

$$v_{ic} > V_{SS} + v_{Tp2} + v_{ovload2},\qquad\text{Eq. (35)}$$

where $v_{Tp2}$ is the threshold voltage of $M_6$ 604 (or $M_7$ 606), and $v_{ovload2}$ is the overdrive voltage of $M_{19}$ 1016 (or $M_{20}$ 1016). Normally, $v_{Tp2} < 0$, but $|v_{Tp2}| > |v_{ovload2}|$.

Likewise, the upper limit of $v_{ic}$ can be expressed as shown in Eq. (36):

$$v_{ic} < V_{DD} + v_{Tp3} - v_{ovM8} + v_{dsM22} + v_{noffset},\qquad\text{Eq. (36)}$$

where $v_{Tp3}$ is the threshold voltage of $M_{17}$ 1006 (or $M_{18}$ 1008), $v_{ovM8}$ is the overdrive voltage of $M_8$ 608, $v_{dsM22}$ is the drain-to-source voltage of $M_{22}$ 1024, and $v_{noffset}$ is the sum of the absolute values of the threshold and overdrive voltages of $M_{23}$ 1028 (or $M_{25}$ 1034). Normally, $v_{Tp3} < 0$ and $v_{dsM22} < 0$. $M_{22}$ 1024 works in the linear region as a switch. It is possible that $v_{noffset} > -v_{Tp3} + v_{ovM8} + v_{dsM22}$. By comparing Eq. (23) with Eq. (35), it can be seen that the upper limit of the input common mode signal range desirably can be maintained greater than or equal to $V_{DD}$. Similarly, by comparing Eq. (24) with Eq. (36), it can be seen that the lower limit of the input common mode signal range desirably can also be maintained less than or equal to $V_{SS}$.

The above explanation of the present invention has been in the context of employing it in a differential amplifier. However, in a more general sense, the present invention relates to a method of extending an input signal range of any component that receives a signal. The skilled artisan would appreciate that, in this general sense, the present invention can be realized in any number of embodiments in which a circuit first level shifts the voltage of the input signal and then processes the input signal.

Figure 11:
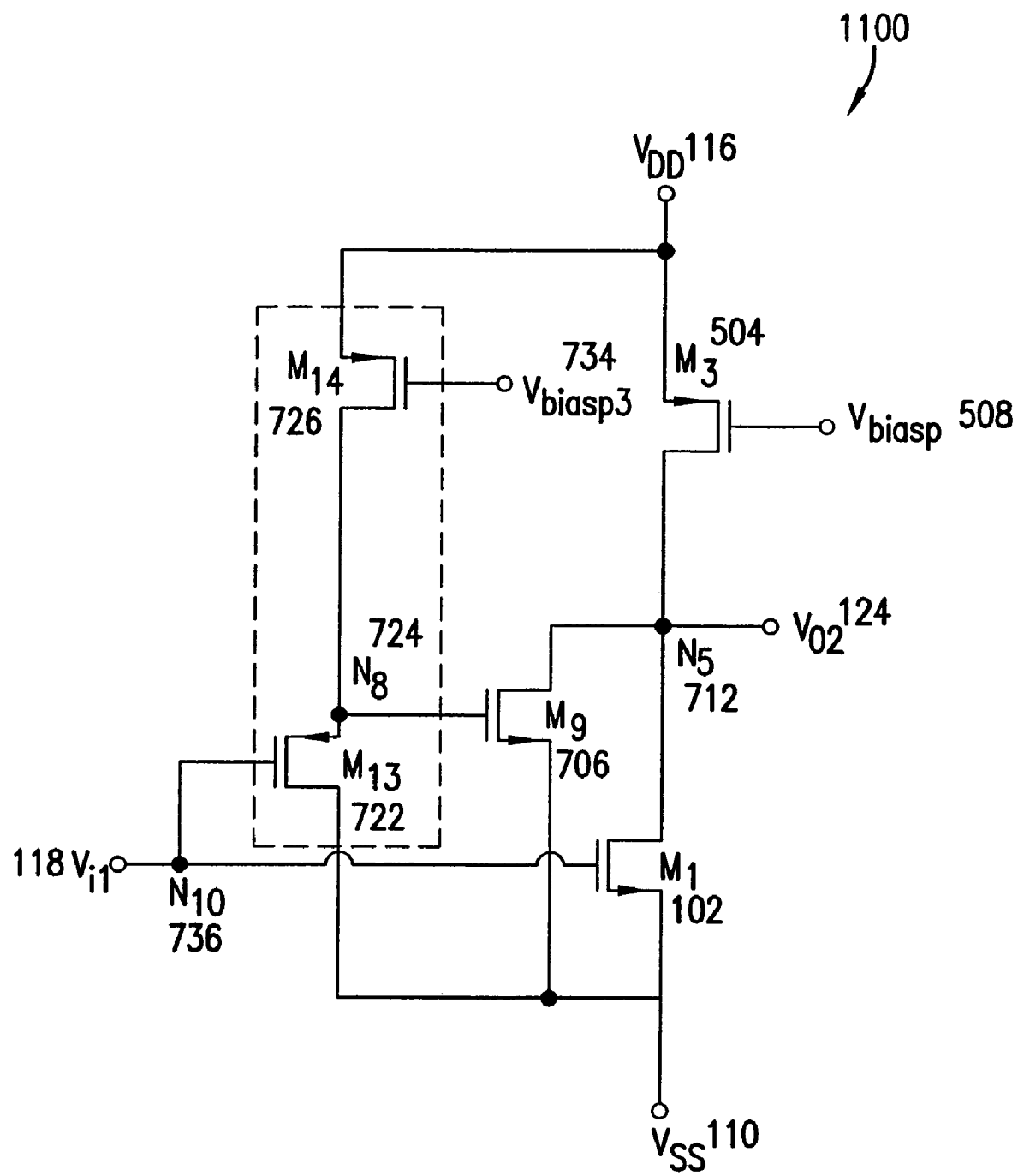
FIG. 11 is a schematic diagram of a single-input amplifier 1100 of the present invention.

FIG. 11 is a schematic diagram of a single-input amplifier 1100 of the present invention. Single-input amplifier 1100 comprises first amplifying transistor $M_1$ 102 and second amplifying transistor $M_9$ 706 with drain terminals connected at first node $N_5$ 712. The source terminals of $M_1$ 102 and $M_9$ 706 are connected to $V_{SS}$ 110. Load transistor $M_3$ 504 is connected between $V_{DD}$ 116 and $N_5$ 712. In addition to providing active load, $M_3$ 504 also acts as a current source for single-input amplifier 1100. The source terminal of $M_3$ 504 is connected to $V_{DD}$ 116. First bias voltage $V_{biasp}$ 508 holds $M_3$ 504 in saturation. The source terminal of voltage offset transistor $M_{13}$ 722 is connected with the gate terminal of $M_9$ 706 at second node $N_8$ 724. The drain terminal of $M_{13}$ 722 is connected to $V_{SS}$ 110. Second current source transistor $M_{14}$ 726 is connected between $V_{DD}$ 116 and $N_8$ 724. Second bias voltage $v_{biasp3}$ 734 holds $M_{14}$ 726 in saturation.

Input signal $v_{i1}$ 118 is applied to the gate terminals of both $M_1$ 102 and $M_{13}$ 722 at input terminal $N_{10}$ 736. Output signal $v_{o2}$ 124 is produced at $N_5$ 712, which is the output terminal. Configured as they are, $M_{13}$ 722 and $M_{14}$ 726 form source follower 744, where $M_{13}$ 722 is the driven MOSFET and $M_{14}$ 726 is the non-driven MOSFET. Thus, the voltage at $N_8$ 724, $v_{N8}$, can be expressed as shown above in Eq. (27):

$$v_{N8} = v_{i1} - v_{TpM13}, \quad \text{Eq. (27)}$$

where $v_{TpM13}$ is the threshold voltage of $M_{13}$. Normally, $v_{TpM13} < 0$. Thus, $M_{13}$ 722 acts to level shift $v_{i1}$ 118 by the threshold voltage. Source follower 744 comprises an offset circuit. Thus, while $M_1$ 102 directly amplifies $v_{i1}$, $M_9$ 706 amplifies $v_{N8}$. Hence, $M_9$ 706 indirectly amplifies $v_{i1}$ because of the voltage drop across $M_{13}$ 722.

For single-input amplifier 1100, the lower limit of $v_{i1}$ 118 can be expressed as shown in Eq. (37):

$$v_{i1} > V_{SS} + v_{Tn2} - v_{poffset}, \quad \text{Eq. (37)}$$

where $v_{Tn2}$ is the threshold voltage of $M_9$ 706, and $v_{poffset}$ is the sum of the absolute values of the threshold and overdrive voltages of $M_{13}$ 722. It is possible that $v_{poffset} > v_{Tn2}$.

Likewise, the upper limit of $v_{i1}$ can be expressed as shown in Eq. (38):

$$v_{i1} < V_{DD} + v_{Tn} - v_{ovload}, \quad \text{Eq. (38)}$$

where $v_{Tn}$ is the threshold voltage of $M_1$ 102, and $v_{ovload}$ is the overdrive voltage of $M_3$ 504. Normally, $v_{Tn} > v_{ovload}$. Thus, the upper limit of the input signal range desirably can be maintained greater than or equal to $V_{DD}$, and the lower limit of the input signal range desirably can also be maintained less than or equal to $V_{SS}$.

In single-input amplifier 1100, $M_1$ 102 and $M_9$ 706 are NMOSFETs, while $M_3$ 504, $M_{13}$ 722, and $M_{14}$ 726 are PMOSFETs. However, one skilled in the art would recognize that other transistor configurations could also be used.

Figure 12:
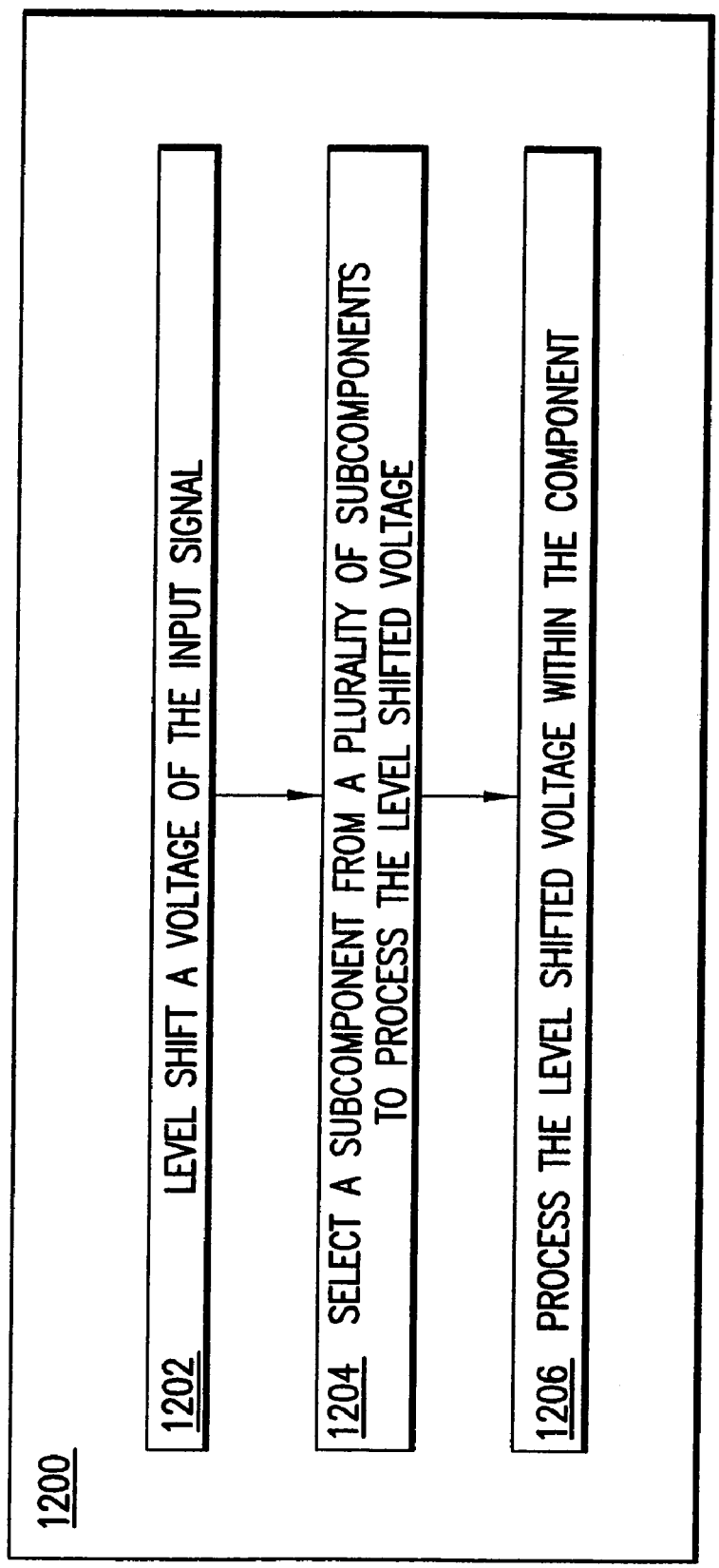
FIG. 12 shows a flow chart of a method 1200 for extending an input signal range of a component that receives a signal.

FIG. 12 shows a flow chart of a method 1200 for extending an input signal range of a component that receives the input signal. In method 1200, at a step 1202, a voltage of the input signal is level shifted. This is done to compensate the input signal for bias voltages within the component that limit the voltages of the input signal to a range less than the desirable voltage range. The desirable voltage range spans between the voltages that supply power to the component. For example, offset transistors $M_{13}$ 722 and $M_{15}$ 728 level shift, respectively, input signals $v_{i1}$ 118 and $v_{i1}$ 120, by the threshold voltages.

Optionally, at a step 1204, a subcomponent from a plurality of subcomponents is selected to process the level shifted voltage. In an embodiment, the subcomponent is selected in response to a comparison between a common mode voltage of the input signal and a reference signal. For example, $M_{11}$ 716 controls the current flow to differential pair 502 based on $v_{ic}$ 736. Likewise, $M_{12}$ 718 controls the current flow to differential pair 704. Based on the instantaneous value of $v_{ic}$ 736, $M_{11}$ 716 and $M_{12}$ 718 act to control which of differential pairs 502, 704 dominates the other during amplification. When a greater portion of the total current flows through $M_{12}$ 718, differential pair 704 provides more amplification than differential pair 502. Thus, differential pair 704 is selected to process the level shifted voltage.

At a step 1206, the level shifted voltage is processed within the component. In an embodiment, the offset voltage is amplified within the component. For example, differential pair 704 amplifies $v_{N8}$ and $v_{N9}$, thus processing the level shifted voltages. Because of the voltage drop across $M_{13}$ 722 and $M_{15}$ 728, differential pair 704 indirectly amplifies $v_{i1}$ and $v_{i2}$.

Conclusion

While various embodiments of the present invention have been described above, it should be understood that they have been presented by way of example, and not limitation. It would be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A differential amplifier, comprising:
   a differential input capable of receiving a differential signal;
   a first differential pair coupled to said differential input;
   a second differential pair, coupled to said differential input, and connected in parallel with said first differential pair at a differential output;
   a differential offset circuit, coupled between said differential input and said second differential pair, and capable of level shifting said differential signal from a first level to a second level, said differential offset circuit having a first source follower coupled between a first input terminal of said differential input and a first amplifying transistor of said second differential pair and a second source follower coupled between a second input terminal of said differential input and a second amplifying transistor of said second differential pair; and
   a differential switch circuit, coupled to said first differential pair and said second differential pair, and capable of controlling a first current flow to said first differential pair and a second current flow to said second differential pair;
   wherein said differential output is capable of receiving a differential voltage output signal.

2. The differential amplifier of claim 1, wherein said first amplifying transistor is a first field effect transistor and said second amplifying transistor is a second field effect transistor.

3. A differential amplifier, comprising:
   a differential input capable of receiving a differential signal;
   a first differential pair coupled to said differential input;
   a second differential pair, coupled to said differential input, and connected in parallel with said first differential pair at a differential output; and
   a differential offset circuit, coupled between said differential input and said second differential pair, and capable of level shifting said differential signal from a first level to a second level, said differential offset circuit having a first source follower coupled between a first input terminal of said differential input and a first amplifying transistor of said second differential pair and a second source follower coupled between a second input terminal of said differential input and a second amplifying transistor of said second differential pair, wherein said first source follower comprises a third field effect transistor with a source terminal connected to a gate terminal of said first field effect transistor and a fourth field effect transistor with a drain terminal connected to said gate terminal.

4. The differential amplifier of claim 3, wherein said first field effect transistor and said second field effect transistor are a first type that is one of a NMOSFET and a PMOSFET.

5. The differential amplifier of claim 4, wherein said third field effect transistor and said fourth field effect transistor are a second type, said second type being opposite of said first type.

6. The differential amplifier of claim 1, wherein said differential switch circuit comprises:
a first switch transistor coupled between said first differential pair and a current source; and
a second switch transistor coupled between said second differential pair and said current source.

7. The differential amplifier of claim 6, wherein said first switch transistor is a first field effect transistor and said second switch transistor is a second field effect transistor.

8. The differential amplifier of claim 1, wherein said first differential pair comprises a first field effect transistor with a first drain terminal, and a second field effect transistor with a second drain terminal, and said second differential pair comprises a third field effect transistor with a third drain terminal connected to said first drain terminal, and a fourth field effect transistor with a fourth drain terminal connected to said second drain terminal.

9. An amplifier, comprising:
an input capable of receiving an input signal;
a first amplifying transistor coupled to said input;
a second amplifying transistor, coupled to said input, and connected in parallel with said first amplifying transistor at an output;
an offset circuit, coupled between said input and said second amplifying transistor, and capable of level shifting said input signal from a first level to a second level, said offset circuit having a source follower coupled between said input and said second amplifying transistor; and
a switch transistor, coupled to said first amplifying transistor and said second amplifying transistor and coupled between said first amplifying transistor and a current source, and capable of controlling a first current flow to said first amplifying transistor and a second current flow to said second amplifying transistor;
wherein said output is capable of receiving a voltage output signal.

10. The amplifier of claim 9, wherein said second amplifying transistor is a first field effect transistor.

11. An amplifier comprising:
an input capable of receiving an input signal;
a first amplifying transistor coupled to said input;
a first field effect transistor, coupled to said input, and connected in parallel with said first amplifying transistor at an output; and
an offset circuit. coupled between said input and said second amplifying transistor, and capable of level shifting said input signal from a first level to a second level, said offset circuit having a source follower coupled between said input and said second amplifying transistor, wherein said source follower comprises a second field effect transistor with a source terminal connected to a gate terminal of said first field effect transistor and a third field effect transistor with a drain terminal connected to said gate terminal.

12. The amplifier of claim 11, wherein said first field effect transistor is a first type that is one of a NMOSFET and a PMOSFET.

13. The amplifier of claim 12, wherein said second field effect transistor and said third field effect transistor are a second type, said second type being opposite of said first type.

14. The differential amplifier of claim 9, wherein said switch transistor is a field effect transistor.

15. The amplifier of claim 9, wherein said first amplifying transistor is a first field effect transistor and said second amplifying transistor is a second field effect transistor.

16. A method of extending an input signal range of a component that receives an input signal, comprising the steps of:
(1) level shifting a voltage of the input signal;
(2) responding to a comparison between a common mode voltage of the input signal and a reference voltage to select a subcomponent, from a plurality of subcomponents within the component, to amplify said level shifted voltage; and
(3) amplifying said level shifted voltage within the component.

* * * * *